United States Patent [19]

Schulke

[11] Patent Number: 4,806,868
[45] Date of Patent: Feb. 21, 1989

[54] NMR SPINNER SPEED CONTROL

[75] Inventor: George F. Schulke, Sunnyvale, Calif.

[73] Assignee: Varian Associates, Inc., Palo Alto, Calif.

[21] Appl. No.: 120,574

[22] Filed: Nov. 13, 1987

[51] Int. Cl.[4] .......................................... G01R 33/20
[52] U.S. Cl. ................................................ 324/321
[58] Field of Search ............... 324/300, 307, 318, 321, 324/322

[56] References Cited

U.S. PATENT DOCUMENTS

| | | | |
|---|---|---|---|
| 2,960,649 | 11/1960 | Blooh | 324/321 |
| 3,681,683 | 8/1972 | Huber | 324/321 |
| 3,746,971 | 7/1973 | Storey | 324/321 |
| 3,911,355 | 10/1975 | Leane | 324/321 |
| 4,491,276 | 1/1985 | Reeves | 415/123 |

Primary Examiner—Michael J. Tokar
Attorney, Agent, or Firm—Stanley Z. Cole; Gerald M. Fisher; Edward H. Berkowitz

[57] ABSTRACT

An NMR sample spinner comprises first rotational torque means to impart a first rotation to a sample rotor and a second rotational torque means for applying a rotational torque of selected magnitude opposite that applied by said first rotational torque means, whereby positive rotational rate control is more precisely and rapidly realized, sense of rotation is controlled, and undesired rotational torque may be compensated.

4 Claims, 1 Drawing Sheet

NMR SPINNER SPEED CONTROL

FIELD OF THE INVENTION

The invention is in the field of instrumentation for analysis of samples by nuclear magnetic resonance and particularly relates to mechanisms for rotation of a sample in such instrumentation.

BACKGROUND OF THE INVENTION

The study of radio frequency magnetic resonance spectra of samples is facilitated by rotation of the sample about an axis which is usually disposed to coincide with the polarizing magnetic field of the instrument, or at a desired angle thereto. Spinning the sample has the effect of averaging over undesired nonaxial magnetic field gradients. Control of the spin rate is an important function and automated spin rate control in a servo arrangement is not uncommon. Whether a manual or closed loop arrangement, the response time for spin rate control from a faster to a slower rotational rate, is often undesirably lengthy due to the very reduced frictional forces operative in the air bearing. Moreover, the very small variations in the structure of the rotor or stator of the spinner frequently give rise to small rotational torques affecting performance. In the prior art it was known to utilize friction braking, aerodynamic damping (with vanes attached to the rotor), and controlled eddy currents for the purpose of controllably reducing the spinning sets of an NMR sample spinner. These are discussed for example in U.S. Pat. No. 3,911,355.

A typical sample spinner incorporates facility for levitating the rotor within the stator, imparting a rotational torque to the rotor and stabilizing the rotational axis against wobble. These functions are ordinarily accomplished with appropriately disposed pressurized gas jets.

SUMMARY OF THE INVENTION

It is desired to improve the performance and response of a sampler spinner in an NMR spectrometer. In the present invention a conventional first rotational gas jet(s) is supplemented with another jet(s) arranged to oppose the effect of the first jet(s) by imparting a torque of opposite sign and selected magnitude to the rotor. In this way, a positive braking action can be implemented providing a more precise control over the sample spinner, a capability to select the sense of rotation, and to modulate the sample rotation rate and to completely stop sample rotation. Moreover, undesired rotational torques arising from imperfection in practical fluid bearings may be partially or wholly compensated with the selectably controlled torque of either sense.

DETAILED DESCRIPTION OF THE INVENTION

Figure 1:
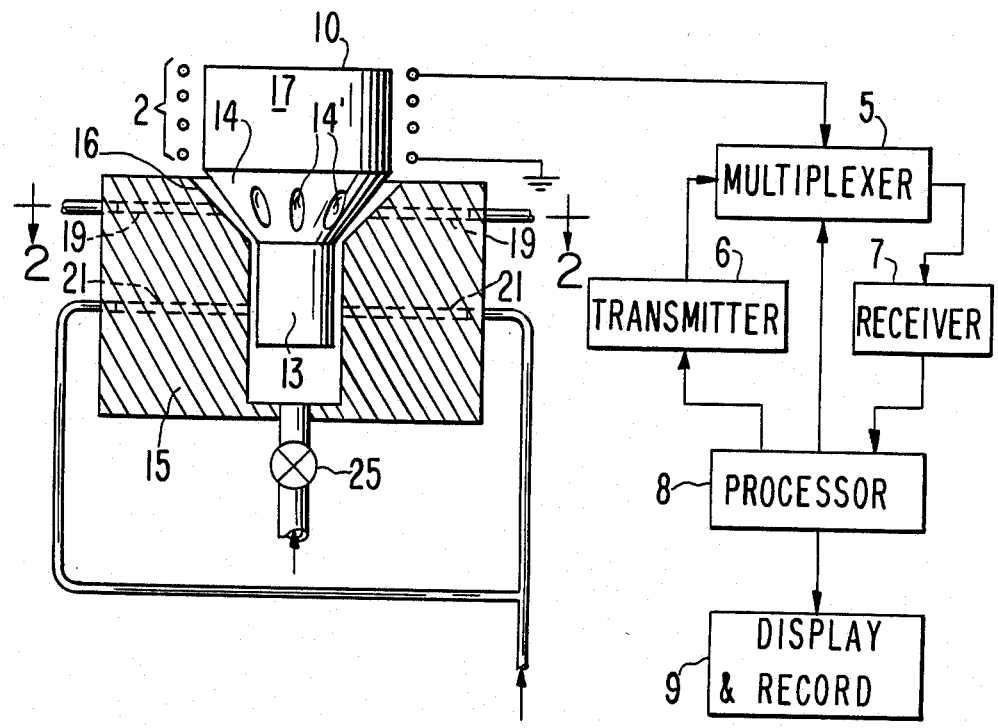
FIG. 1 is a section through a sample spinner of the present invention.

Turning now to FIG. 1, there is shown a common arrangement illustrating the present invention. The sample spinner system is situated within the bore of a magnet, not shown. The sample spinner is surrounded by an RF probe coil 2 which provides RF excitation for resonating nuclei, and subsequently operates to pick up the signal emitted by de-exciting nuclei of the sample. The probe coil 2 is shared for these functions through multiplexer 5 operating to alternately connect probe coil 2 to transmitter 6 and receiver 7 for the separate purposes of excitation and signal acquisition. Transmitter 6 includes modulation apparatus control by processor 8, and receiver 7 includes a digitization means and phase resolving means. Processor 8 controls the multiplexer 5, transmitter 6, and receiver 7 and other apparatus not shown, such as magnetic field stabilization and homogenization equipment, for example.

The spinner includes rotor 10, which in turn has keel portion 13 and rotor bearing surface 14. Stator 15 includes stator bearing surface 16. The sample is contained in a sample well 17 in the rotor 10. Stator incorporates jets 19 in the stator bearing surface 16 and radial stabilizing jets 21 directed toward keel portion 13 of rotor 10.

Figure 2:
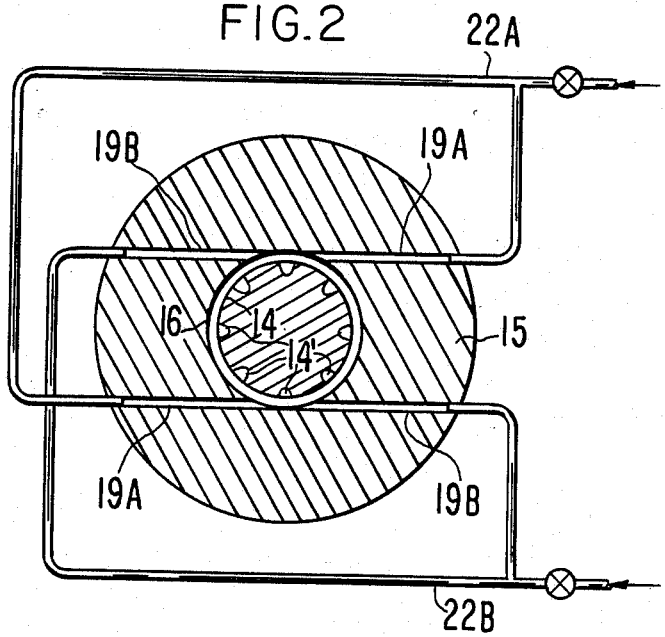
FIG. 2 is a transverse section through an embodiment of the present invention.

FIG. 2 indicates one arrangement for the jets 19, where a first pair of jets 19a are disposed to direct a pressurized gas substantially tangentially directed onto bearing surface 14 of the rotor to bear against scalloped indentations 14a. Those jets 19a produce a torque tending to rotate rotor 10 in one sense (counterclockwise, as seen in FIG. 2). A second set of jets, 19b, case an oppositely-directed torque. Separate pressurization circuits 22a and 22b for the respective jets 19a and 19b permit the rotation rate in sense to be controlled through relative pressures at the respective jets.

A valve 25, and corresponding pressure source, is commonly provided to pneumatically expel the sample and rotor from the system.

Although certain embodiments are described above in detail, it will be appreciated that other embodiments are contemplated and that modifications of the disclosed features are within the scope of the invention.

What is claimed is:

1. In an NMR spectrometer, spinner apparatus for rotating a sample under study, comprising
   a rotor for holding said sample,
   a stator surrounding said rotor, said stator forming a gas bearing in which said rotor is levitated by pressurized gas means incorporated in said stator, said stator comprising first torque means for imparting rotating in a first sense to said rotor, and second torque means for selectively imparting rotational torque to said rotor in a sense opposite said first sense, said first torque means comprising at least one first gas jet disposed to direct a stream of pressurized gas substantially tangential to the periphery of said rotor in a first direction whereby said rotor is caused to rotate in a first sense, said torque means comprising at least one second gas jet disposed to direct a stream of pressurized gas substantially tangential to the periphery of said rotor in a direction substantially opposite said first direction, whereby said second torque means opposes rotation of said rotor induced by said first torque means.

2. The spinner apparatus of claim 1, said first and second jets each comprising respective torque means for selecting the pressure magnitude applied to first and second jets whereby the rotational rate is precisely controlled.

3. The apparatus of claim 2, wherein either said respective means capable of reduction to zero whereby the sense of rotation is selectable.

4. In an NMR spectrometer, the method of controlling the rotational rate of a rotor containing a sample for a spinner of said spectrometer comprising
  directing a first gas jet to supply a first rotational torque to said rotor to cause rotation of said rotor at a rotational rate in excess of a desired rate,
  opposing said first rotational torque by applying a second gas jet to supply a second rotational torque of selected magnitude to said rotor, said second rotational torque opposite in sense said first rotational torque, whereby said rotational rate is reduced.

* * * * *